(12) United States Patent
Mavencamp et al.

(10) Patent No.: US 6,775,387 B1
(45) Date of Patent: Aug. 10, 2004

(54) THREE-STEP RAMPED REFERENCE TO REDUCE POPPING NOISES ON AUDIO CIRCUIT

(75) Inventors: Daniel A. Mavencamp, Brandon, MS (US); Ronnie Bean, Brandon, MS (US); Tim Colvin, Ridgeland, MS (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/452,035

(22) Filed: Nov. 30, 1999

(51) Int. Cl.[7] .......................... H04B 15/00; H03F 21/00; H03F 1/14
(52) U.S. Cl. ................... 381/120; 381/94.5; 381/94.1; 381/123; 381/104; 51/127
(58) Field of Search ............................... 381/120, 94.1, 381/94.5, 94.8

(56) References Cited

U.S. PATENT DOCUMENTS

| | | | |
|---|---|---|---|
| 3,919,685 A | * 11/1975 | Haill | 367/65 |
| 5,151,942 A | * 9/1992 | Sasaki | 381/94.5 |
| 5,642,074 A | * 6/1997 | Ghaffaripour et al. | 330/51 |
| 5,796,303 A | * 8/1998 | Vinn et al. | 330/51 |
| 5,939,938 A | * 8/1999 | Kalb et al. | 330/51 |
| 6,281,821 B1 | * 8/2001 | Rhode et al. | 341/144 |

* cited by examiner

Primary Examiner—Minsun Oh Harvey
Assistant Examiner—Andrew Graham
(74) Attorney, Agent, or Firm—Wade James Brady, III; Frederick J. Telecky, Jr.

(57) ABSTRACT

Provided is a method (500) and audio circuit (100) for reducing popping noise in a load (140, 145) connected to the audio circuit, especially during audio circuit start-up. The method applies a time varying voltage (364) to the load that has a smooth, S-shaped curve when plotted over time. The device include an integrated circuit (IC) set as a channel block (110), a load connected between the channel block and ground, a bypass control (150) connected to the channel block for producing a controlled ground reference voltage having an S-shaped curve to the channel block, a shunt control (170) controlling the voltage delivered across the load, and a ground capacitor (160) coupled between the bypass control and ground. The channel block typically includes an amplifier which supplies the output voltage across the load. The bypass circuit generally includes a bypass generator and a transistor selectively providing a charge to the ground capacitor.

20 Claims, 2 Drawing Sheets

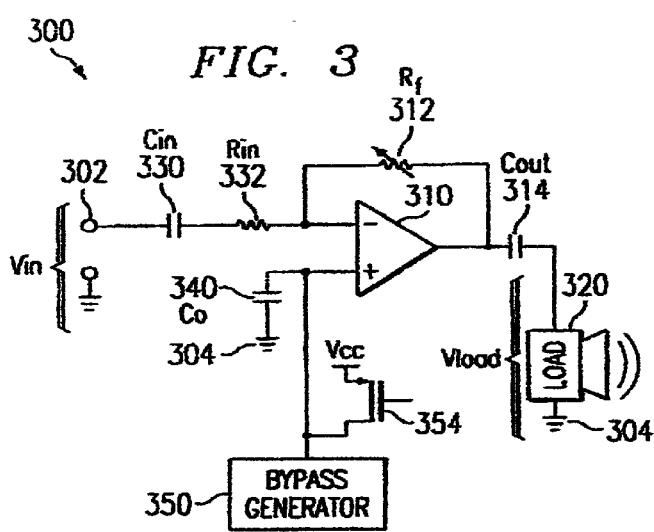
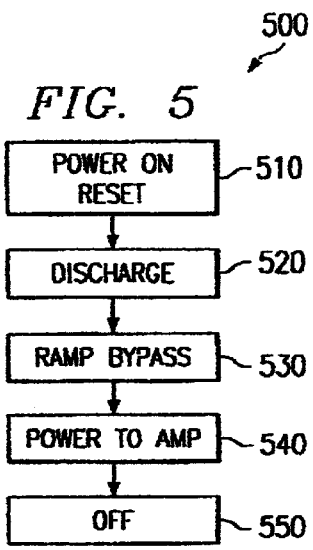
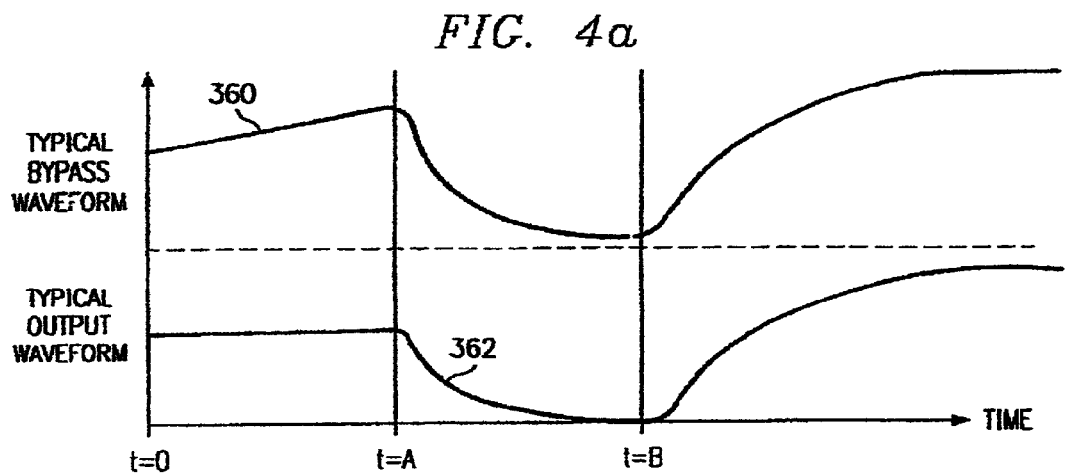
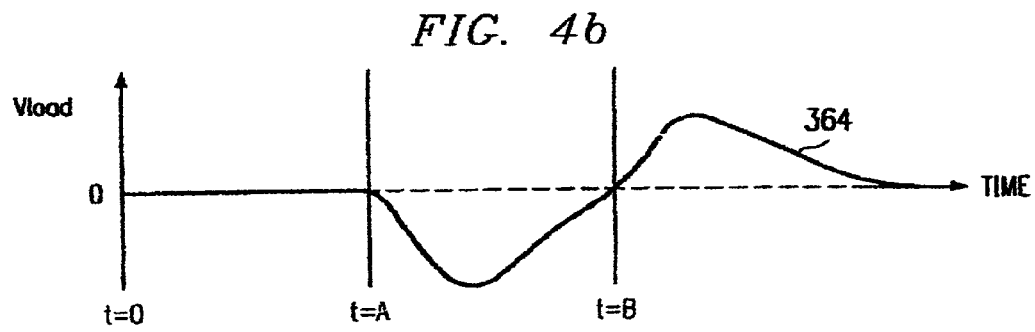

THREE-STEP RAMPED REFERENCE TO REDUCE POPPING NOISES ON AUDIO CIRCUIT

TECHNICAL FIELD

The present invention relates generally to audio circuits, and, more specifically, to a method and device for reducing popping noises in audio circuits that drive speakers.

BACKGROUND OF THE INVENTION

Since the early days of sound reproduction, audio amplifiers (amps) have been used to produce an audible output from a weak input signal. Originally, a mechanical megaphone attached to a diaphragm provided sound amplification. Then, as electrical technology advanced, vacuum tubes provided an electrical platform for amplifying an audio signal. Electrical sound amplification provides many advantages over mechanical sound application—for example, a much smaller magnetically activated speaker replaced the large mechanical megaphone. Unfortunately, electrical audio amplification introduced a distortion—the "hiss," "whistle," "crack," and "pop" (collectively "popping noise") which are associated with audio circuit start-up. These sounds are caused when currents in the audio circuit (or a load attached to the audio circuit) "spike," meaning that the currents get too large for the speaker.

More recently, solid-state integrated circuits (ICs) have been used to reproduce and amplify audio signals. Other solid-state devices, such as digital signal processors (DSPs), have been applied to audio circuits to control the amplification of a small electrical signal into audible sound. Accordingly, ICs have enabled audio circuits to shrink in size from a unit about the size of a filing cabinet to a unit about the size and weight of a credit card. The miniaturization of audio circuits has been accomplished while simultaneously increasing the reliability of audio circuits. For example, a vacuum tube based audio circuit would often required several repairs each year, while a modern IC audio circuit may need replacement after several years of service. Furthermore, an IC audio circuit is much less expensive than previous circuits. In fact, it is much cheaper to replace an IC audio circuit than to repair any previous audio amplifier. However, IC audio circuits still have internal capacitors, which are responsible for the popping noises. Accordingly, IC based audio circuits still experience the popping noise that has been associated with turning on an audio circuit since the era of vacuum tubes.

Several schemes have been attempted in an effort to control popping noises. In one scheme, the voltage in the audio circuit is increased very slowly taking as many as thirty seconds to a full minute to increase to a full operating voltage. However, slowly increasing the voltage in the audio circuit has the obvious disadvantage of delaying the operation of the audio circuit, and will either create a long silent period for the listener, or the listener will hear a soft pop followed by a gradual increase in volume until a full volume is reached. This increase in volume is often called the open "warm-up" of the audio circuit.

Another scheme limits the user's ability to quickly increase the amplifier gain. Unfortunately, this scheme does not provide an operator of the audio circuit with the volume or power control one often needs. This is a particular problem in audio circuits that function as audio channel equalizers, such as those used in recording studios. Other proposed solutions have run into other limitations, such as limitation imposed by the number of connection pins on the audio circuit, as well as limitations due to the die space available on the audio circuit.

Therefore, what is needed is a system and method of reducing popping noise in audio circuits. It would be advantageous for the solution to use few pins on the audio circuit and would occupy a small amount of die space. The present invention provides such a system and method.

SUMMARY OF THE INVENTION

The present invention achieves technical advantages as an audio circuit and a method of operating the audio circuit that reduces popping noises during audio circuit start-up. One embodiment of the audio circuit includes a voltage generator configured as a bypass generator for producing a smooth S-shaped voltage- on the non-inverting input of an audio amplifier, which is used to monitor a reference voltage. A method according to the present invention places an S-shaped curve on the non-inverting input of an audio amplifier. The use of an S-shaped curve as a reference voltage greatly reduces the magnitude of the current "spike" and the time it takes an audio circuit to recover from the current "spike." Accordingly, the present invention reduces the popping noise in audio circuits while using little additional die space and few additional pins.

The invention provides an audio circuit that includes an amplifier that has an inverting input for receiving an electric input, a non-inverting input for receiving a controlled ground voltage, and an amplifier output which places an output voltage across a load. Each channel in the audio circuit has its own amplifier. The invention also includes a bypass generator that has an output line which is connected to the non-inverting input, and produces on the output line a voltage having a magnitude which is generally a smooth curve, which is preferably an S-shaped curve, when the voltage magnitude is plotted over time. In addition, the audio circuit includes a ground capacitor connected between the output line and a true ground. Furthermore, the audio circuit includes a state machine coupled to the amplifier and the bypass generator. The state machine controls the voltage across the load by placing the audio circuit in three distinct states.

The audio circuit also includes a transistor connected to the bypass generator output line which produces a charge on the ground capacitor. A first comparator and a second comparator are connected to a state machine. The first comparator compares the voltage on the amplifier output to the voltage on the ground capacitor. The second comparator compares the voltage on the amplifier output to the true ground. The amplifier has a state machine-controlled shunt, and an operator controlled variable resistor connected in parallel to provide feedback to the amplifier. Furthermore, in audio amplifiers having loads that are single ended, there is a load capacitor coupled between the load and the amplifier.

In another embodiment, the present invention is configured to provide an audio circuit that includes an integrated circuit (IC) set having an input and an output for a channel, a load connected between the output and ground, and a bypass control connected to the channel block by a bypass control line. A channel block is provided for each channel in the audio circuit. The bypass control provides a generally S-shaped curve to the channel block. A shunt control is coupled between the channel block and the bypass control and controls the voltage across the load, and a ground capacitor is coupled between the bypass control line and ground. The bypass control provides a bypass generator coupled between the shunt control and the ground capacitor as well as a transistor coupled between a voltage source and the ground capacitor (the transistor also has a connection to the state machine, which controls current flow through the transistor). The shunt control provides a state machine, as well as a first comparator and a second comparator. The first comparator has an output connected to the state machine, a first input connected to the ground capacitor, and a second input connected to the channel block. The second comparator has an output connected to the state machine, a first input connected to the ground capacitor, and a second input connected to the channel block, and a third input connected to ground.

The channel block includes an amplifier and a shunt connected between an amplifier output and an inverting input of the amplifier. The channel block also includes an input capacitor connected to the audio circuit input, an input resistor coupled between the input capacitor and the inverting input of the amplifier, and a variable resistor coupled between the inverting input and the amplifier output. Furthermore, the channel block provides a load capacitor coupled between the amplifier output and the load.

In another aspect, the invention is a method of reducing a popping noise in a load connected to an audio circuit. The method includes the steps of supplying a voltage source to the audio circuit, charging a ground capacitor until a voltage across a ground capacitor is at least equal to the voltage across a load capacitor, configuring an amplifier to function as a current sink, sinking a charge on audio circuit capacitors, and then applying a voltage to the load. The voltage applied to the load has a dynamic magnitude that appears as a generally smooth curve, such as an S-shaped curve, when plotted over time.

BRIEF DESCRIPTION OF THE DRAWINGS

Various aspects of the invention, including some alternative embodiments, are understood by reference to the following Detailed Description of a Preferred Embodiment, which can be better understood by reference to the drawings, in which:

FIG. 3 illustrates a schematic circuit diagram for a headphone implementation of the present invention;

FIG. 4a shows a typical bypass waveform and a typical output wave form;

FIG. 4b illustrates a waveform for the voltage across a load; and

FIG. 5 is a block flow diagram which illustrates the steps in practicing one embodiment of the present invention.

DETAILED DESCRIPTION OF A PREFERRED EMBODIMENT

The present invention is an audio circuit and a method of operating the audio circuit during start-up that reduces popping noise. The audio circuit has a bypass generator for producing a smooth S-shaped voltage on the non-inverting input of an audio amplifier, which produces a smooth S-shaped voltage on a load. The method places an S-shaped curve on the audio circuit and load during audio circuit start-up. The use of a smooth S-shaped curve as a reference voltage reduces the magnitude of current spikes, as well as the time it takes an audio circuit to recover from the current spike.

Figure 1:
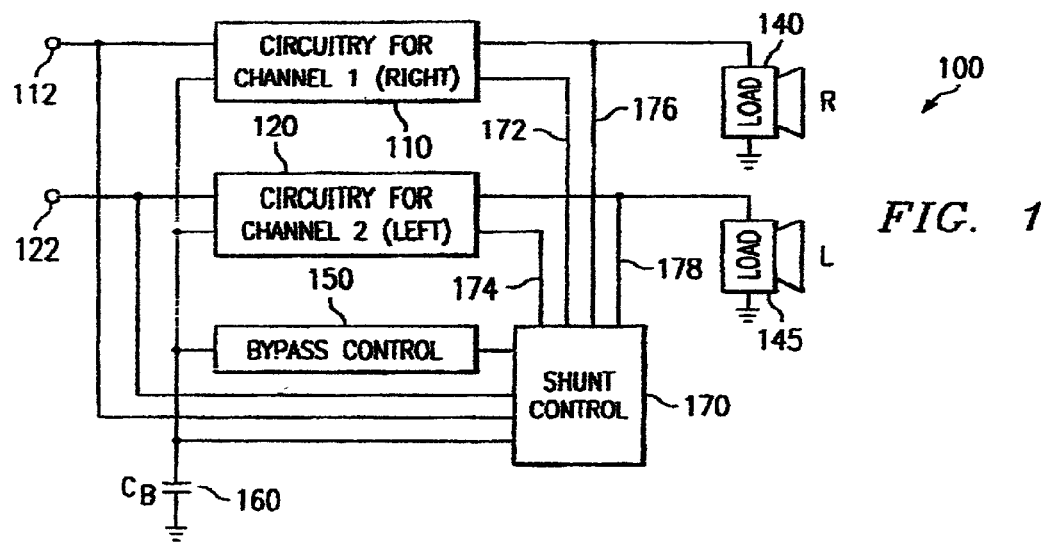
FIG. 1 is a block diagram of an audio circuit having a left channel and a right channel according to the present invention.

The present invention provides technical advantages in audio devices having an audio circuit. FIG. 1 is a block diagram of an audio circuit 100 having a left channel and a right channel. A first channel block 110 such as an Integrated (IC) circuit set comprises circuitry used to create a right stereo channel output for the right channel, and a second channel block 120 comprises circuitry used to create a left stereo channel output for the left channel. The audio circuit 100 has a ground capacitor 160 identified as $C_B$ which is shared by the channels, and is typically in the range of 0.1 to 1 microfarads ($\mu F$), however, smaller or larger capacitors may be used depending on the application. In general, the ground capacitor 160 provides a reference voltage for the audio circuitry.

Feedback from each channel block 110, 120 in the audio circuit 100 is fed into a shunt control 170 via lines 172 and 174, respectively. Shunt control 170 enables and disables circuitry in each channel of the audio circuit 100 via lines 176 and 178, respectively, to place the channels in one of a plurality of predefined states. By controllably placing the channel blocks 110, 120 in predefined states, the shunt control 170 selectively dictates whether each channel block 110, 120 is supplying a voltage to loads 140, 145, respectively. The first load 140 and the second load 145 are typically speakers, such as those found in a home entertainment system, which have an impedance of either 4 ohms or 8 ohms. Alternatively, the first load 140 and the second load 145 may be headphones, such as the speakers associated with a portable handheld audio systems which have an impedance of 16 ohms or 32 ohms. The shunt control 170 also regulates the bypass control 150.

The bypass control 150 manipulates the reference voltage charge provided by the ground capacitor 160, and may superimpose a predetermined waveform, in particular, at least a smooth S-shaped curve, on the reference voltage. Each channel block 110,120 receives the reference voltage form the ground capacitor 160. Together, the reference voltage delivered through the bypass control 150 and the operational state of the channel blocks 110, 120 as dictated by the shunt control 170, determine the voltage delivered to the loads 140, 145. In one state, a waveform generated by the bypass control 150 is provided to and processed by the first channel block 110 and the second channel block 120 to responsively produce a corresponding predetermined waveform on the first load 140 and the second load 145, respectively. When the predetermined waveform is selected by bypass control 150 to be a smooth S-shaped curve, the voltage delivered to the first load 140 and the second load 145 is also corresponding S-shaped. Advantageously, by applying the S-shaped curve to the loads 140, 145, along with or without the other normal audio signals, popping noise is reduced.

Although a two channel audio device is shown, a channel block is can be provided for each channel in an audio system. For example, a surround sound stereo has a front left channel, a front right channel, a back left channel, a back right channel, and sometimes a subwoofer channel. A surround sound stereo having five channels may correspondingly have five channel blocks.

Figure 2:
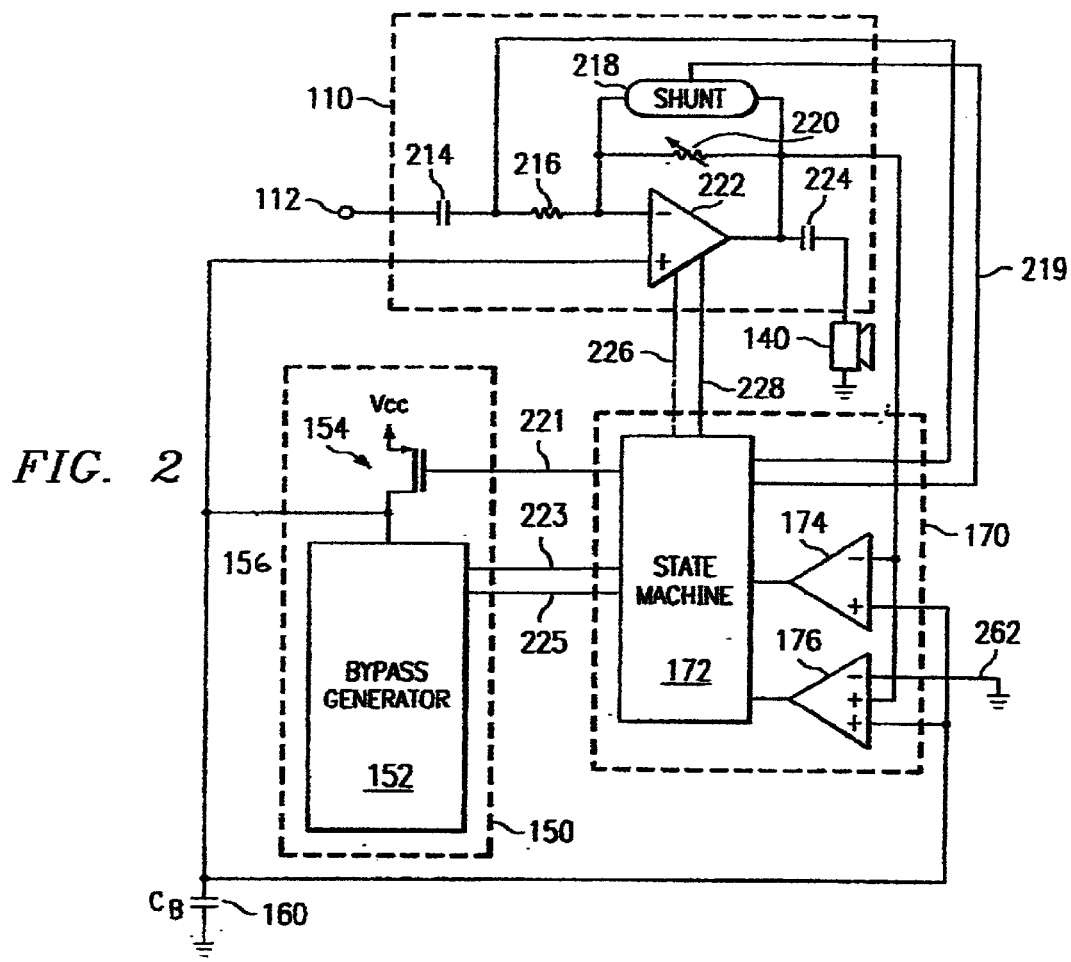
FIG. 2 provides a schematic circuit diagram of one embodiment of the present invention.

FIG. 2 provides a more detailed circuit diagram for the audio circuit 110 according to the present invention. FIG. 2 illustrates in greater detail the channel block 110, the bypass control 150, and the shunt control 170. Furthermore, the ground capacitor 160 provides the reference voltage for the channel block 110 and the bypass control 150.

The bypass control 150 consists generally of a bypass generator 152 and a switch depicted as a transistor 154. The bypass generator 152 produces, on command, a smooth S-shaped curve signal on output line 156. Although an S-shaped curve signal is disclosed and described as preferred, other smooth curve signals could be produced as well. The shape of the signal curve, in this case an S-shaped curve, is predetermined by the circuitry comprising the bypass generator 152. The transistor 154 provides the ability to rapidly increase the reference voltage on the ground capacitor 160. Typically, at start up, the charging time of the ground capacitor 160 will be reduced by pulling extra current through the transistor 154 until the voltage on the ground capacitor 160 is determined to be at least equal to a voltage on a load capacitor 224.

The shunt control 170 generally comprises a state machine 172, a first comparator 174, and a second comparator 176. The state machine 172 can be any self-resetting 3-state state machine or its equivalent. The state machine 172 accepts an input signal from the first comparator 174 and in input signal from the second comparator 176, and base on these input signals, sets the state of the channel block 110. The state machine controls the state of the channel block 110 through an amplifier 222 via a PMOS disable line 226 and an AMP enable line 228. When the PMOS disable line 226 is active, the audio circuit 110 is said to be in an Enable Sink mode. When the AMP enable line 228 is active, the audio circuit 110 is said to be in an enable AMP mode. In addition, the state machine 172 opens and closes a shunt 218 line 219, turns on and off the transistor 154 via line 221, and activates the bypass generator 152 via lines 223 and 225, as required by the selected state.

The first comparator 174 compares the output of the AMP 222 to the reference voltage provide by the ground capacitor 160. Likewise, the second comparator 176 compares both the output of the AMP 222 and the reference voltage provided by the ground capacitor 160 to a true ground shown at 262. The first comparator 174 and the second comparator 176 could be implemented via PMOS, NMOS, BJT, or any other IC technology.

The channel block 110 provides amplification of an input signal provided to the audio circuit at input 112. The channel block 110 comprises amplifier 222 as well as other circuitry needed to provide the amplification of the input signal and to place a desired voltage, including a carrier voltage and a signal voltage, across the load 140. The amplifier 222 could be implemented in an integrated circuit, and constructed by using PMOS, NMOS, BJT, or other type of IC devices. As with any amplifier, the amplifier 222 provides a gain. Accordingly, the amplifier 222 increases an input, which is typically an electrical signal, received at an input 112, to an output, which is typically an electrical signal, which is large enough to be processed by the load 140, which is preferably a speaker, into an audible sound. In addition to the amplifier 222, other components are provided in the channel block 110.

A series input capacitor 214 in the range of 0.2 to 1 micro-farads, and an input resistor 216, which is typically in the range of 1K–10K ohms in size (chosen to match that of the input capacitor 214), are used together to provide a lowpass filter have a frequency of about 20 hertz. The gain of the amplifier 222 is controlled by a user who manipulates a variable resistor 220 thereby changing the volume of the audio signal generated by speaker 140. The shunt 218 connected in parallel across variable resistor 220 allows the amplifier 222 to selectively sink current by reducing amplification, as well as provide a voltage to the load 140, depending on the state of operation of the audio circuit 110 (as discussed below). The load capacitor 224 provides a filter to the load 140, and is typically provided on a single ended load (such as a headphone), but is not typically included on a bridge tied load, (which is the type of load typically found in a home stereo speaker).

The PMOS disable line 226 feeds into and controls amplifier 222 and, when enabled, places the amplifier 222 in a follower mode, which allows the amplifier 222 to function as a sink and discharge a charge held by the load capacitor 224. This process also discharges voltage on the input capacitor 214. The AMP enable line 228 also connects to AMP 222. When the AMP enable line 228 selectively becomes active, the amplifier 222 operates in its regular mode. Accordingly, to prevent a conflict in amplifier operation, only the PMOS disable line 226 or the enable AMP enable line 228 will be active at any one time.

FIG. 3 illustrates a circuit diagram for an audio circuit 300 that can be used to provide sound to a headphone. The primary components used to implement the audio circuit include a bypass generator 350, a transistor 354, a ground capacitor 340, an amplifier 310, and a load capacitor 314. In addition, an input capacitor 330 and an input resistor 332 provide filter functions, and variable resistor 312 allows an operator to control the gain of the amplifier 310, and thus the volume produced by a speaker 320. An input voltage is defined as the voltage difference between a ground 304 and an input terminal 302. Likewise, a load voltage is shown, and defined as a voltage across the load 320, which is between ground 304 and the load capacitor 314. By showing the devices that directly produce a voltage on the load, the illustration of the audio circuit 300 facilitates understanding of the three states implemented in the present invention, which are illustrated in FIGS. 4a and 4b.

FIG. 4a shows a typical bypass waveform 360 and a typical output waveform 362. The bypass waveform 360 is an illustration of the voltage on the ground capacitor 340, and the output waveform 362 is an illustration of the voltage on the load capacitor 314. FIG. 4b illustrates a waveform 364 for the voltage across the load 320. FIG. 4a illustrates time on a horizontal axis. Time is divided into three time periods, each corresponding to an audio circuit state. Audio circuit state 1 correspond to the time between T=0 and T=A, state 2 corresponds to the time between T=A and T=B, and state 3 corresponds to the time after T=B. The horizontal axis represents the relative magnitude (rather than a particular value) of a voltage.

For the typical output waveform, the horizontal axis represents true ground, or zero volts. For the typical bypass waveform, the dashed horizontal line illustrates the true ground reference. Furthermore, in FIG. 4a no units are shown for time or for voltage. This is because the time length of any state will vary, and because the absolute voltage across the load capacitor 314 and the ground capacitor 340 will also vary.

Accordingly, at T=0 power up begins and the audio circuit 300 prepares to process an audio signal placed on the input 302. To prevent popping noises, the audio circuit goes through state 1, state 2 and state 3. Accordingly, At Time=0, if the voltage across the ground capacitor 340 is determined to be less than the voltage across the load capacitor 314, the voltage across the ground capacitor 340 is steadily increased by responsively enabling the transistor 354 to add a charge to the ground capacitor 340. In addition, in state 1 the amplifier 310 is turned off and the shunt (not shown) is open. Charge is placed on the ground capacitor 340 until the voltage across the ground capacitor 340 equals the voltage across the load capacitor 314. When the voltage on the ground capacitor 340 equals the voltage on the load capacitor 314, the first state is completed. Accordingly, this point is defined in time as time T=A. At T=A the transistor 354 is turned off, the amplifier 310 is disabled (sink mode), and the shunt (not shown) is closed to allow current to sink in state 2.

In state 2 the voltage across the load capacitor 314 and the voltage across the ground capacitor 340 are discharged until the voltage on the load capacitor 314 is equal to the true ground. When the voltage on the load capacitor 314 equals the true ground, the second state ends. This point is defined in time as T=B. The slope of the typical bypass waveform and the slope of the typical output waveform shown in state 2 are a natural result of capacitor discharges.

Next, state 3 begins. In state 3 the bypass generator 350 generates a smooth S-shaped curve and superimposes the S-shaped curve on the connection to the ground capacitor 340. In state 3 the shunt is opened, the amplifier 310 is turned on, and the voltage across the load capacitor 314 generally follows the voltage across the ground capacitor 340. Note that if at power-up the voltage across the ground capacitor is greater than or equal to the voltage across the load capacitor 314 then the duration of the first state 1 the time between T=0 and T=A will be a duration of 0 seconds.

FIG. 4b illustrates time across the horizontal axis which is also broken into three states to correspond to the three states illustrated in FIG. 4a. The vertical axis represents the magnitude of the voltage across the load 320. The plot of the voltage across the load 320 illustrates that the "valley" shown by the plot in state 2 is a controlled minimum value, and in state 3 is a controlled maximum "peak" value. It is the control of the valley and the peak that prevents the popping noise.

The voltage across the load 320 depicted in FIG. 4b appears as effectively the derivative of the typical output waveform shown in FIG. 4a, multiplied by some constant value. Also, since the impedance of a typical audio load is a resistance, the voltage across the load can be examined in terms of the current through the load 320.

Since the voltage across the load 320 is constant in state 1 there is no current through the load 320 in state 1 between T=0 and T=A. In state 2, as the voltage across the load capacitor 314 discharges to the ground voltage, the current through the load 320 is negative. By choosing appropriate capacitance values for the load capacitor 314, a large current valley (associated with prior art devices) can be prevented. This prevents the popping noise associated with a too rapid discharge of the voltage across the load capacitor 314.

In state 3, the bypass generator 350 superimposes a smooth S-shaped curve voltage on the load capacitor 314 (typical output waveform). Accordingly, the current through the load 320 is controlled and a large current spike associated with prior art devices is prevented. Accordingly, in state 3 the current through the load has a controlled maximum peak value that reduces a popping noise.

FIG. 5 is a block flow diagram of the popping noise reduction algorithm 500, according to one embodiment of the present invention. The popping noise reducing algorithm 500 is best followed by referencing FIG. 2. In a power on reset step 510, state 1 begins if the first comparator 174 detects that the voltage across the ground capacitor 160 is less than or equal to the voltage across the load capacitor 224. In other audio circuits having more than one channel, state 1 will be implemented whenever a comparator detects that the voltage across the ground capacitor is less than the voltage across any of the load capacitors. Furthermore, in the power on reset step 510, the state machine 172 will turn on the transistor 154, close the shunt 218, and disable the AMP 222 by turning on the enable sink signal 226. This allows charge to be placed across the ground capacitor 160.

Next, when the voltage across the ground capacitor 160 is greater than or equal to the voltage across the load capacitor 224, the first comparator 174 turns on and state 2 begins. In state 2, the state machine 172 turns off the transistor 154, closes the shunt 218, and enables the AMP 122 by turning on the enable AMP line 228 and turning off the disable PMOS line 226. This prevents the AMP from sourcing current into the load and producing a pop in state 2. The AMP 222 then functions as current sink, allowing the load capacitor 224 and the ground capacitor 160 discharge. In addition, the input capacitor 214 also discharges. The discharge step 520 continues until the voltage across the load capacitor 224 is equal to true ground.

After the discharge step 520, a ramp bypass step 530 begins. The ramp bypass step 530 has its beginning defined by the beginning of state 3, which occurs when the second comparator 176 detects that the voltage across the load capacitor 314 has reached true ground (the voltage on the input capacitors and the ground capacitors are typically less then 20 millivolts at this point). During the ramp bypass step 530 the amplifier 222 remains enabled, the shunt 218 is opened, and the bypass generator 152 is commanded by the state machine 172 to produce a smooth S-shaped reference voltage on the ground capacitor 160. By placing the smooth S-shaped reference voltage on the ground capacitor a smooth S-shaped reference voltage appears on the load capacitor 224 because the load capacitor 224 tracks the voltage across the ground capacitor 160. Then, when the voltage across the load capacitor 224 is approximately equal to the operating voltage for the audio circuit, the preliminary steps for power delivery to the audio circuit are completed and the audio circuit begins regular operating mode.

In the power to AMP step 540, an input signal placed on input 112 is amplified and processed to produce sound at the load 140. Accordingly, the power AMP step 540 continues until the user wishes to quit listening to the audio circuit 200. At this point, the user terminates delivery of power to the audio circuit in an off step 550. The off step 550 will often include discharging the load capacitor 224, preferably to ground. The off step 550 concludes when the audio circuit disables the bypass and wave generation functions and the amplifier reproduces music as in its standard operating mode.

While the invention has been described in conjunction with preferred embodiments, it should be understood that modifications will become apparent to those of ordinary skill in the art and that such modifications are therein to be included within the scope of the invention and the following claims.

We claim:

1. An audio circuit for supplying an output voltage to a load, comprising:

an amplifier having an inverting input terminal for receiving an electrical input and having a non-inverting input terminal coupled through a ground capacitor to a controlled reference potential, said amplifier having an amplifier output terminal producing the output for application across the load;

a load capacitor connected between the output terminal and said reference potential; and a bypass control circuit having a bypass generator with an output line coupled to the non-inverting input terminal, said bypass control circuit initially responsive to a voltage across the ground capacitor less than or equal to the voltage across the load capacitor to disable said amplifier and charge said ground capacitor until the voltage across the ground capacitor is greater than or equal to the voltage across the load capacitor, said bypass control circuit then discharging the load capacitor and the ground capacitor and then enabling the amplifier, said bypass generator then producing a time varying voltage on said non-inverting input terminal having a magnitude which is generally a smooth curve when plotted over time.

2. The audio circuit of claim 1, the control circuit further comprising a state machine functionally coupled to and controlling the amplifier and the bypass generator for controlling the voltage across the load.

3. The audio circuit of claim 1, further comprising a switch connected to the bypass generator output line selectively providing a charge to the ground capacitor.

4. The audio circuit of claim 2 further comprising a first comparator comparing the voltage on the amplifier output to the voltage on the ground capacitor and providing an output indicative of said comparison to the state machine.

5. The audio circuit of claim 2 further comprising a second comparator comparing the voltage on the amplifier output to the true ground and providing an output indicative of said comparison to the state machine.

6. The audio circuit of claim 2 further comprising a shunt being selectively coupled across the amplifier, said shunt controlling the gain of said amplifier.

7. The audio circuit of claim 6 further comprising a state machine controlling the selective coupling of the shunt across the amplifier.

8. The audio circuit of claim 6 further comprising a variable resistor connected in parallel with the shunt.

9. The audio circuit of claim 1 further comprising a load capacitor coupled between the load and the amplifier.

10. An audio circuit for supplying an output voltage to a load, comprising:

an amplifier having an inverting input terminal for receiving an electrical input and having a non-inverting input terminal coupled through a ground capacitor to a controlled reference potential, said amplifier having an amplifier output terminal producing the output for application across the load;

a load capacitor connected between the output terminal and said reference potential;

a channel block circuit having an input terminal and an output terminal;

a bypass control circuit connected to the channel block selectively controlling the state of said channel circuit; and a said ground capacitor coupled between the bypass control circuit and said reference potential;

said bypass control circuit responsive to a voltage across the ground capacitor less than or equal to the voltage across the load capacitor to disable said amplifier and charge said ground capacitor until the voltage across the ground capacitor is greater than or equal to the voltage across the load capacitor, said bypass control circuit then discharging the load capacitor and the ground capacitor and then enabling the amplifier, said bypass generator then producing a time varying voltage on said non-inverting input terminal a having a magnitude which is generally a smooth curve when plotted over time.

11. The audio circuit of claim 10 wherein the bypass control comprises:

a shunt control coupled to the channel block circuit controlling the voltage delivered to the load;

a bypass generator coupled between the shunt control and the ground capacitor and providing an analog voltage signal to the channel block.

12. The audio circuit of claim 10 wherein the shunt control comprises a state machine.

13. The audio circuit of claim 12 further comprising:

a first comparator having first input connected to the ground capacitor and a second input connected to the channel block circuit, and an output connected to the state machine;

a second comparator having a first input connected to the ground capacitor, a second input connected to the channel block, a third input connected to ground and an output connected to the state machine.

14. The audio circuit of claim 10 wherein the audio circuit has a plurality of channel blocks amplifying a signal routed therethrough.

15. The audio circuit of claim 10 wherein the channel block comprises:

a shunt controllably connected between the amplifier output and the inverting input.

16. The audio circuit of claim 15 wherein the channel block comprises:

an input capacitor connected to the channel block input;

an input resistor coupled between the input capacitor and the inverting input; and a variable resistor coupled between the inverting input and the amplifier output.

17. A method of reducing a popping noise in a load connected by an audio circuit during start-up, comprising the sequential steps of:

providing an amplifier having an inverting input terminal for receiving an electrical input and having a non-inverting input terminal coupled through a ground capacitor to a controlled reference potential, said amplifier having an amplifier output terminal producing the output for application across the load;

providing a load capacitor connected between the output terminal and said reference potential;

providing a bypass control circuit having a bypass generator with an output line coupled to the non-inverting input terminal;

said bypass control circuit, initially responsive to a voltage across the ground capacitor and charging said ground capacitor until the voltage across the sound capacitor is greater than or equal to the voltage across the load capacitor, the bypass control circuit then discharging the load capacitor and ground capacitor and then enabling the amplifier, the bypass generator then producing a time varying voltage on said non-inverting input terminal having a magnitude which is generally a smooth curve when plotted over time.

18. The method of claim 17 wherein the step of discharging the voltage across the load capacitor includes the step of configuring an amplifier in the audio circuit such that the amplifier functions as a current sink.

19. The method of claim 17 wherein the time varying voltage has a magnitude which is generally S-shaped when plotted over time.

20. A method of reducing a popping noise in a load connected by an audio circuit during start-up, comprising the sequential steps of:

providing an amplifier having a first input terminal for receiving electrical inputs and a second input terminal coupled through a ground capacitor to a controlled reference potential, said amplifier having an amplifier output terminal producing the output for application across the load;

providing a load capacitor connected between said output terminal and said load; and providing a control circuit having a bypass generator with an output voltage across the ground capacitor less than or equal to the voltage across the load capacitor to disable said amplifier and charge said ground capacitor until the voltage across the ground capacitor is greater than or equal to the voltage across the load capacitor, the bypass control circuit then discharging the load capacitor and the ground capacitor and then enabling the amplifier, the bypass generator then producing a time varying voltage on the second input terminal having a magnitude which is generally a smooth curve when plotted over time.

* * * * *